US009405618B2

(12) United States Patent
Rabenalt et al.

(10) Patent No.: US 9,405,618 B2
(45) Date of Patent: Aug. 2, 2016

(54) MARKER PROGRAMMING IN NON-VOLATILE MEMORIES

(71) Applicant: Infineon Technologies AG, Neubiberg (DE)

(72) Inventors: Thomas Rabenalt, Unterhaching (DE);
Ulrich Backhausen, Taufkirchen (DE);
Thomas Kern, Aschheim (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 129 days.

(21) Appl. No.: 14/289,311

(22) Filed: May 28, 2014

(65) Prior Publication Data

US 2015/0347227 A1    Dec. 3, 2015

(51) Int. Cl.
*G06F 11/10*    (2006.01)
*G11C 29/52*    (2006.01)

(52) U.S. Cl.
CPC ............ *G06F 11/1068* (2013.01); *G11C 29/52* (2013.01)

(58) Field of Classification Search
CPC .................................................. G06F 11/1008
USPC .................................................. 714/764, 774
See application file for complete search history.

(56) References Cited

U.S. PATENT DOCUMENTS

| 2007/0089033 A1* | 4/2007 | Zeevi | G06F 11/1068 714/763 |
| 2009/0116288 A1* | 5/2009 | Varkony | G11C 5/145 365/185.13 |
| 2012/0047323 A1* | 2/2012 | Sareen | G06F 12/0246 711/103 |
| 2014/0124577 A1* | 5/2014 | Wang | G06K 7/10722 235/454 |

* cited by examiner

*Primary Examiner* — Fritz Alphonse
(74) *Attorney, Agent, or Firm* — Slater Matsil, LLP

(57) ABSTRACT

A method and a memory controller for accessing a non-volatile memory are disclosed. The method includes reading a first memory region of the non-volatile memory, ascertaining whether the first memory region contains a predetermined data pattern wherein the predetermined data pattern has no influence on resulting error correcting data determined for at least the first memory region. The method evaluating a data status for a second memory region of the non-volatile memory on the basis of a presence of the predetermined data pattern in the first memory region, wherein the data status indicates at least one of whether valid data is present within the second memory region and whether the second memory region is writable.

23 Claims, 10 Drawing Sheets

FIG 1A

*State 1:* Arbitrary Data

*State 2:* Invalidation: Prog 0xFF...F

| Address | Data | | | | | | | | | | | | | | | ECC = f(Data) | | | |
|---|---|---|---|---|---|---|---|---|---|---|---|---|---|---|---|---|---|---|---|
| not used | 0 | 1 | 0 | 0 | 0 | 1 | 1 | 0 | 0 | 1 | 1 | 1 | 1 | 1 | 0 | 0 | 1 | 0 | 0 |
| not used | 1 | 1 | 1 | 1 | 1 | 1 | 1 | 1 | 1 | 1 | 1 | 1 | 1 | 1 | 1 | 1 | 1 | 1 | 1 |

Invalidation works because address bits are not used
Possible for Memories where 0xFF..FF is allowed to be a valid codeword

FIG 1B

Invalidation: Prog 0xFF...F

| Address | | | Data | | | | | | | | | | | | | | ECC = f(Address, Data) | | | |
|---|---|---|---|---|---|---|---|---|---|---|---|---|---|---|---|---|---|---|---|---|
| 0 | 1 | 0 | 0 | 1 | 0 | 0 | 0 | 1 | 1 | 0 | 0 | 1 | 1 | 1 | 1 | 0 | 1 | 0 | 1 | 1 |
| 0 | 1 | 0 | 1 | 1 | 1 | 1 | 1 | 1 | 1 | 1 | 1 | 1 | 1 | 1 | 1 | 1 | 1 | 1 | 0 | 1 |

Invalidation does not work, due to use of address bits a former "1" in ECC would need to be a "0" now
This is not possible with programming
Even if address is not used the use of 0xFF...FFF as valid codeword may not be allowed due to safety targets

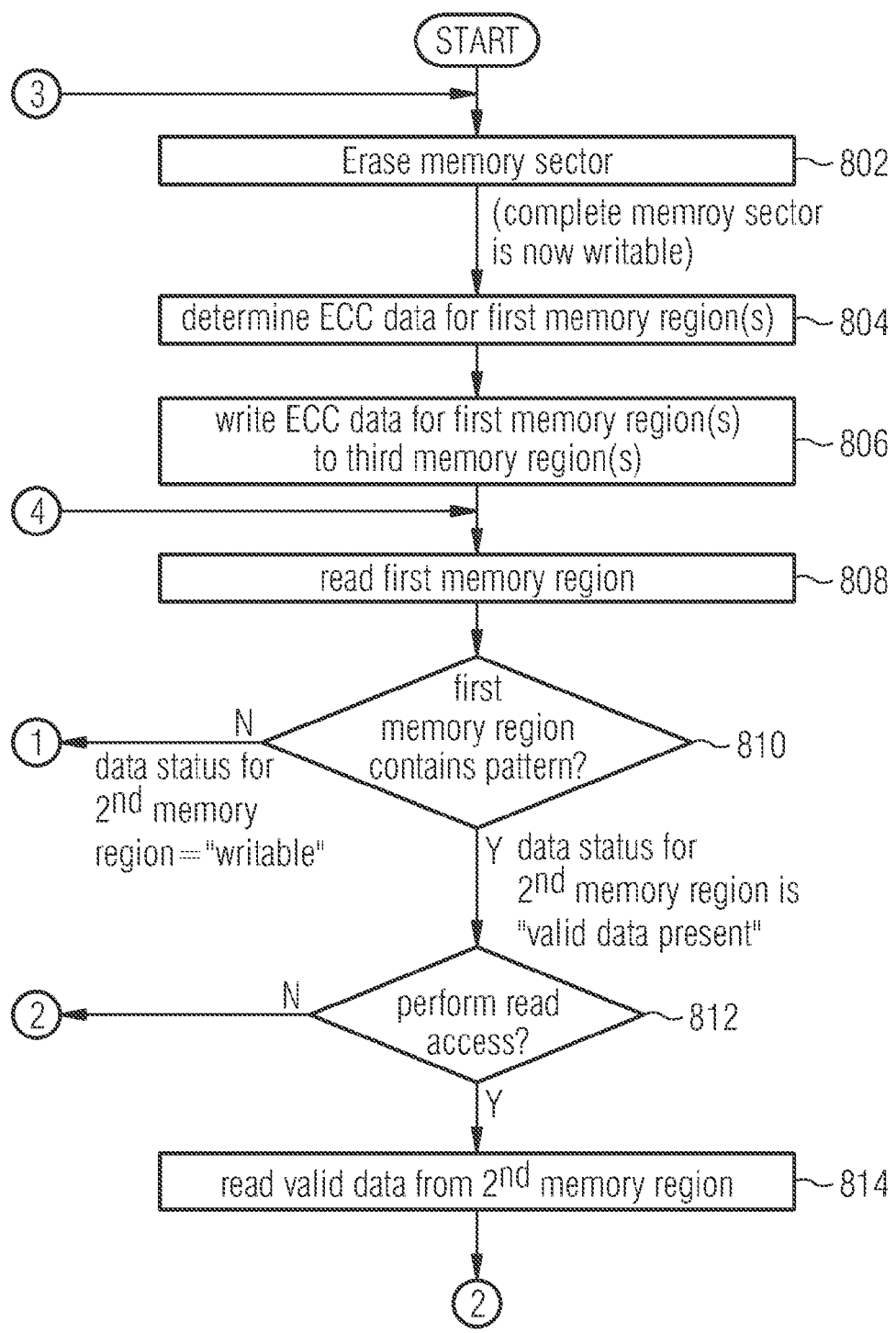

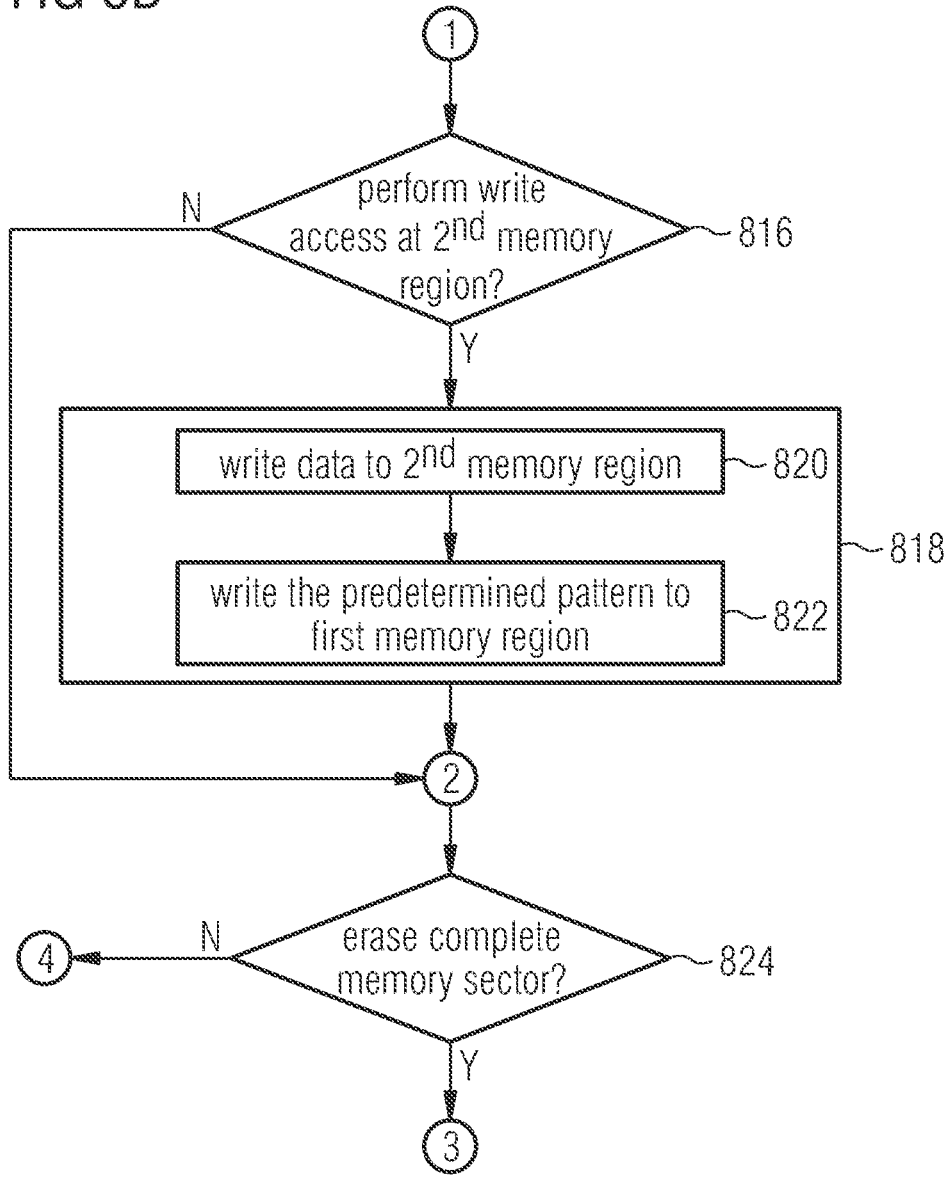

MARKER PROGRAMMING IN NON-VOLATILE MEMORIES

TECHNICAL FIELD

Embodiments of the present invention relate to a method for accessing a non-volatile memory. Further embodiments of the invention relate to a method which programs a predetermined data pattern as a marker over existing data in a memory region within a non-volatile memory. Further embodiments relate to a non-transitory computer-readable medium storing a program corresponding to at least one of the aforementioned methods. Further embodiments of the invention relate to a memory controller. Some embodiments may relate to marker programming over existing data in flash memories.

BACKGROUND

A flash memory is an electronic non-volatile digital storage medium that can be electrically erased and reprogrammed. A flash memory typically comprises an array of memory cells made from floating-gate transistors. Technically, the flash memory is a type of EEPROM (electrically erasable programmable read-only memory). One of the reasons for using a Flash memory instead of EEPROM is that it offers much more memory cells per area because a bit-per-bit alterability like in EEPROM is not possible with Flash: it is only possible to erase entire blocks, whereas it is possible to program individual bits. This means that to change some part one first needs to erase the whole block.

Today, flash memories are widely used in, for example, personal computers, PDAs, smartphones, digital cameras, microcontrollers, and many more.

Flash memories typically require special considerations, due to their internal configuration, when performing read access, write access, and/or erase access on data stored or to be stored in flash memories. Furthermore, flash memories may be prone to a relatively high bit error rate (BER), especially after a long storage time (up to several years, possibly even 20 years) that flash memories are designed for. The high bit error rate can be dealt with by means of error correction codes (ECC) in order to calculate redundant data ("checkbits") and store such redundant data along with the actual data to be stored. These properties of flash memories define some constraints on how a flash memory can be used. In particular, modifying data (even if it is a single bit only) in a flash memory may require copying an entire memory block or sector to another memory block or sector. It would be desired if some of these usage constraints imposed by flash memories could be alleviated, at least.

SUMMARY

A method for accessing a non-volatile memory is provided. The method comprises reading a first memory region of the non-volatile memory. The method further comprises ascertaining whether the first memory region contains a predetermined data pattern. The predetermined data pattern has no influence on resulting error correcting data determined for at least the first memory region. The method also comprises evaluating a data status for a second memory region of the non-volatile memory on the basis of a presence or an absence of the predetermined data pattern in the first memory region.

According to further aspects, a method is provided. The method comprises programming a predetermined data pattern as a marker over existing data in a memory region within a non-volatile memory. The predetermined data pattern has the property that error correcting data for the memory region and also stored in the non-volatile memory is not modified by a presence or an absence of the predetermined data pattern. A condition for the existing data is that bits in the existing data do not occur at bit positions that are needed for bits of the predetermined data pattern. Upon an upcoming read access or write access to the memory region, it is evaluated whether the memory region contains the predetermined data pattern and a data status of the memory region is determined on the basis of a presence or an absence of the predetermined data pattern in the memory region.

A memory controller is also provided. The memory controller comprises an error correcting unit for processing data to be stored in a non-volatile memory to obtain corresponding error correcting data also to be stored in the non-volatile memory, and for performing error detection and correction on the basis of data and corresponding error correction data read from the non-volatile memory. The flash memory controller further comprises a pattern programmer for writing a predetermined data pattern to a memory region of the non-volatile memory. The predetermined data pattern has no influence on resulting error correcting data determined for at least the first memory region. The flash memory controller also comprises a pattern comparator for comparing data read from a first memory region of the non-volatile memory with the predetermined data pattern, and for evaluating a data status for a second memory region of the non-volatile memory on the basis of a presence of an absence of the predetermined data pattern in the first memory region.

Before embodiments are described in detail using the accompanying figures, it is to be pointed out that the same or functionally equal elements are given the same reference numbers in the figures and that a repeated description for elements provided with the same reference numbers is omitted. Hence, descriptions provided for elements having the same reference numbers are mutually exchangeable.

BRIEF DESCRIPTION OF THE DRAWINGS

FIGS. 8A and 8B show a schematic flow diagram of a method for accessing and managing a non-volatile memory;

DETAILED DESCRIPTION OF ILLUSTRATIVE EMBODIMENTS

In the following, some implementation examples will be explained with specific reference to a flash memory. However, the description and the figures are not to be understood as limited to flash memories, but instead also to other types of non-volatile memories. One property of flash memories typically is that single bits can only be programmed but not erased, at least not in a bit-individual manner. This means that by programming it is possible to change a "0" to a "1" in a bit-individual manner, but it is typically not possible to change an already existing "1" to a "0". In flash memories typically the entire data of one relatively large block is erased concurrently. Due to this constraint, data that needs to be changed may have to be relocated from the currently used block to an already erased block, wherein upon writing the data to the erased block the data is modified in the desired manner. In case an error correcting code is employed, the resulting error correcting data typically also changes along with the modified data (in particular, the error correcting data may change significantly, even though the actual data has changed in a single bit, only). It is also possible that the error correcting data takes into account the memory address of the memory word where the data and the corresponding error correcting data are stored. In this case, the error correcting data typically will change when copying the data from a first memory block to a second, erased memory block.

In other words, a change of a "1" to a "0" is only possible if the whole word is erased. In flash memory the erase is usually only possible over a "sector" or block containing "many" words. Note that the definition of logic "1" and "0" for "programmed" and "erase" states may be also vice-versa, that is, in some flash memories in may be possible to change a "1" to a "0", but not a "0" back to a "1".

Furthermore, due to safety requirements certain implementations of ECC on Flash memory use the following aspects. The address may be encoded into the error correcting data so that ECC=f(address, data).

Another safety requirement may define that an erased (all-0) or programmed word (all-1) must not be ecc valid.

This leads to at least two specific problems which are addressed by the proposed methods, flash memory controller, and non-transitory computer-readable medium:

1. Programming valid ECC words "over" existing words in a flash memory and get again a valid ECC word ('2's cannot be erased).

2. Using a marker with two distinct contents in flash memory where erased words are not ECC valid and therefore cannot be used.

Figure 1:
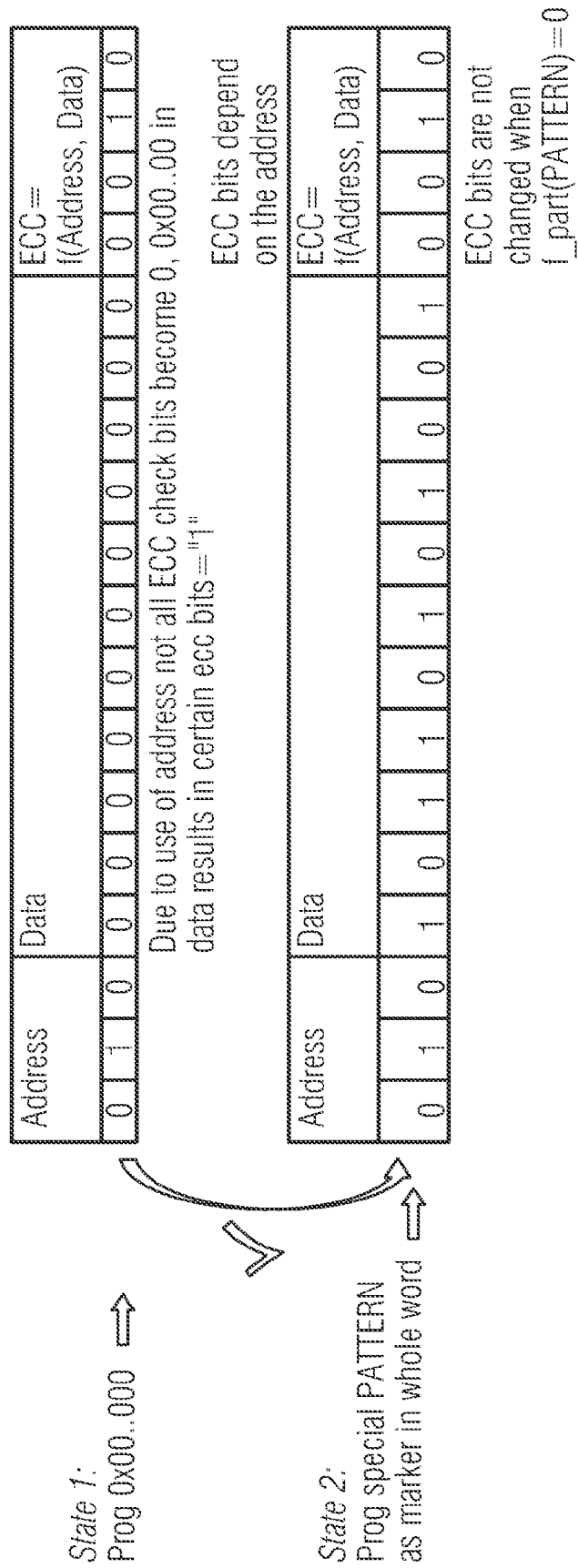
FIG. 1A schematically illustrates a state of the art way to program an all-1 data word (0xFF . . . F) "over" existing Flash data which is often used as a kind of invalidation of that data wherein the invalidation is successful due the assumed side conditions (or constraints) for FIG. 1A.
FIG. 1B schematically illustrates an invalidation of a memory word by writing an all-1 data word to the memory word, wherein the invalidation is unsuccessful due to the assumed side conditions (or constraints) for FIG. 1B; the assumed conditions mean that for some error correcting codes an all-1 word is not a valid codeword; a word with data bits all "1" would have some error correcting bits being not "1" but "0"

FIG. 1 schematically illustrates an invalidation of a memory word by writing an all-1 data word (0xFF . . . F) to the memory word. However, this method depends on the assumption that an all-1 data word is or may be ECC valid. Furthermore, the error correcting data also has to be an all-1 word, due to the flash memory constraint that individual bits cannot be erased. In other words, if the error correcting data for the existing data had a "1" at a particular bit position, but the error correcting data for the all-1 data word would require a "0" at the same bit position, it is typically not possible to erase only the single affected bit. For this reason, the following assumption regarding the error correcting code is made in the context of FIG. 1A:

ECC=(11 . . . 1)=f((11 . . . 1))=f(0xFF . . . F).

Another assumption that has been made in the context of FIG. 1A is that the address is not taken into account by the error correcting code.

With these assumption or side conditions, FIG. 1A can be explained as follows. In state 1, a memory word of the flash memory contains arbitrary data, here (01000110001). The corresponding error correcting data that has been stored is ECC=(1100)=f(Data)=f(01000110001).

Note that either the data or the error correcting data or both may contain bit errors for various reasons (error when writing the data, bit error occurred during storage time, due to radiation or temperature, . . . ). As long as the number of bit errors is less than half the distance (e.g., Hamming distance) of the employed error correcting code, the bit errors typically can be successfully corrected.

It may now be that the data is no longer valid and has to be invalidated. To this end, the state is changed from state 1 to state 2. This modification of the data status is performed by writing the all-1 data to the memory word. At the same time, the error correcting data is also changed to all-1 data. These changes to the data and to the error correcting data are possible because no bit needs to be erased (i.e., changed from "1" to "0"), but the only changes that occur are changes from "0" to "1", which are allowed. Hence, FIG. 1A illustrates an invalidation that works because the address bits are not used by the error correcting code. This invalidation is possible for memories where 0xFF . . . FF is allowed to be a valid code word.

However, one should bear in mind that the all-1 programming in FIG. 1A destroys the previous content of the word. For this reason, such all-1 programming has only limited use (e.g., invalidation). Furthermore, the error correcting code cannot make use of address encoding in this case. If address encoding were used, as schematically illustrated in FIG. 1B, at least at some addresses the all-1 word (combined data and error correcting data) may not be a valid code word, due to address encoding. As can be seen in FIG. 1B, the invalidation does not work, because due to the use of address bits a former "1" in the error correcting data would need to be a "0" (indicated by an arrow in FIG. 1B) after the invalidation, yet this is not possible with bit-individual programming in flash memories.

In the alternative or in addition, other safety requirements may result in an all-1 word not being a valid code word. For example, even if the address is not used, the use of 0xFF . . . FF as valid codeword may not be allowed due to safety targets.

Another option is the erasure of information, but in flash memories this may only be possible on a bigger "granularity", e.g., a wordline or a sector. Erasing data on a wordline or sector level may bring about an increased risk of losing other information (for example, when copying the data to another wordline/sector), which might be undesirable for security and/or safety reasons. Furthermore, the erasure of data may be time consuming. It is further possible, that a reset has to be performed, which may interrupt the operation of the flash memory and, consequently, that of a connected host system (e.g., a microcontroller).

Figure 2:
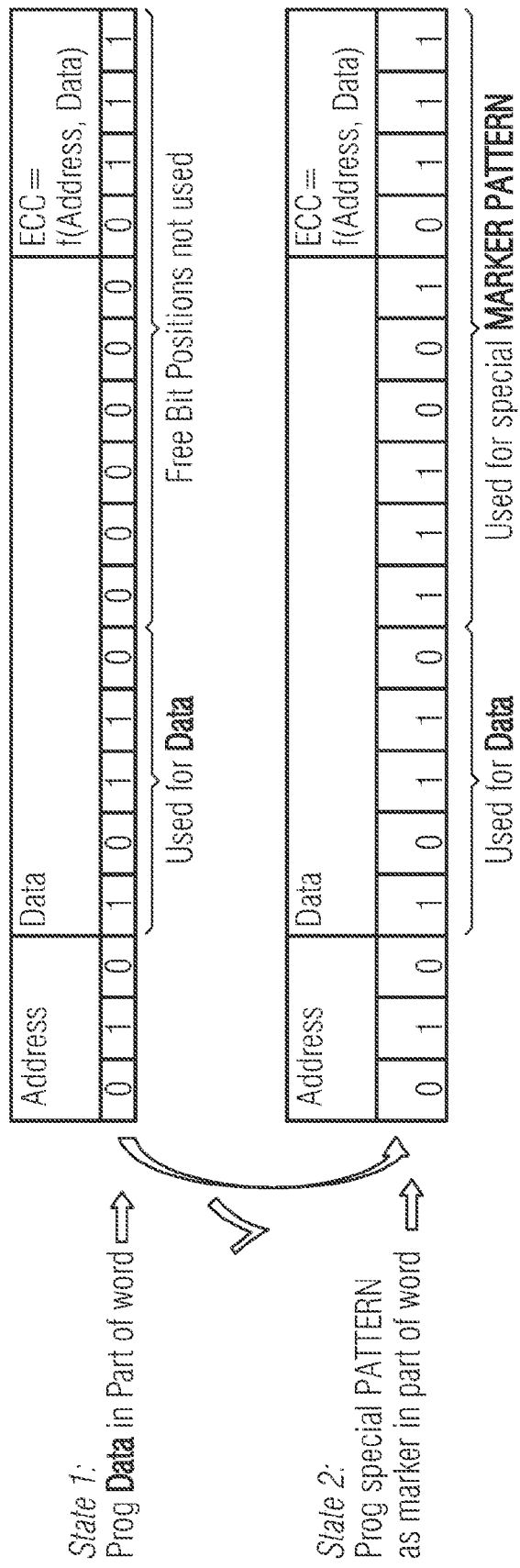
FIG. 2A schematically illustrates a modification of a data status of a memory word, wherein a special pattern is programmed as a marker in the entire memory word.
FIG. 2B schematically illustrates a modification of a data status of a memory word, wherein a special pattern is programmed as a marker in a part of the memory word.

FIG. 2A schematically illustrates a modification of a data status of a memory word, wherein a special pattern is programmed as a marker in the entire memory word. FIG. 2B shows a similar modification of a memory word, wherein a special pattern is programmed as a marker in a part of the memory word. A dedicated pattern is calculated with the following properties:

The dedicated pattern (predetermined data pattern) is ECC valid and has "0"s on positions where the original data needs to be maintained.

Adding the pattern to the memory word does not change the existing ECC checkbits (i.e., ecc(pattern)=0). (e.g., possible for linear ecc codes.)

This pattern can be programmed "over" an existing word_old which is either all-0 in data range or uses a part of data bits which is not used by the pattern.

The method according to FIG. 2A or 2B is based on programming a valid ECC word (pattern) on a memory position where already a valid ECC word is available (word_old). This is called "over-programming".

Due to flash memory properties, (logic "1" cells are not erased during the programming) the result is:

word_new=word_old OR pattern, wherein OR is a bitwise OR.

Programming is possible for every address, because ecc (pattern)=0 for every address.

The existing data word_old may contain all-0 in data. The error correcting data ecc bits are usually not all="0" if address is encoded with the data. This is schematically illustrated in FIG. 2A. Due to the use of the address typically not all ECC checkbits become "0". Rather, 0x00 . . . 00 in data typically results in certain ecc bits="1". At some few selected addresses, it may occur that all ECC checkbits are "0".

In the alternative, as schematically illustrated in FIG. 2B, the existing data may also contain arbitrary data in a certain bit range. In FIG. 2B, this bit range corresponds to the 5 most significant bits (MSBs) of the memory word. The remaining six bits (six least significant bits, LSBs) of the memory word are free bit positions which are not used during state 1.

The predetermined data pattern (dedicated pattern) is either:

on a complete memory word (if original data is all-0)→see FIG. 2A or only on bit positions of a residual bit range ("0") not being used by word_old data bits→see FIG. 2B.

Programming is possible over the whole memory range as long as the partitioning of old data/pattern is same for all words, and if the pattern contains a sufficient number of bits to enable Gen_Mat x pattern=0 (=ECC bits), wherein Gen_Mat is the generator matrix of the error correcting code. The necessary number of bits depends on the characteristics of the code and the matrix (hamming distance, number of linear independent matrix columns, . . . )

Compared to FIG. 1A, the methods in FIGS. 2A and/or 2B provide a more flexible solution. Especially in the case of FIG. 2B, old data is preserved and can still be read. It is possible to use the methods according to FIGS. 2A and 2B with Safety ECCs where all-1 patterns are not allowed.

It is now possible to assign a first data status to an absence of the predetermined data pattern, and a second data status to a presence of the predetermined data pattern within a memory region such as a memory word. For example, in FIG. 2B the absence of the predetermined data pattern or "marker" may be interpreted as the data in the five MSBs being valid, and the presence of the predetermined data pattern may indicate that the data in the five MSBs is not valid anymore. In alternative implementations, the opposite convention may be used: the absence of the predetermined data pattern indicates invalid data and the presence of the predetermined data pattern indicates valid data.

It is also possible to use the over-programming of the predetermined data pattern for "invalidating" existing data. For example, the first data state ("marker state 1") could be:

data=<existing data, 0, ecc_checkbits>.

The second data state ("marker state 2") could be:

data=<existing data, predetermined pattern, ecc_checkbits>.

The error correcting data in the form of the ecc_checkbits are based on the existing data (and possibly the address). The error correcting data ecc_checkbits are not modified by the predetermined_pattern. In this sense, by using the predetermined_pattern one does not distinguish whether it is allowed to program something in the other memory region (the "second memory region") or whether valid data are already present, but whether in the other memory region (i.e., the "second memory region") valid or invalid data are present.

As an extension, two or more predetermined data patterns having the above mentioned properties may be used. For example, when using two predetermined data patterns it would be possible to indicate the following sequence of data status: "writable"→"valid data"→"invalid data". The data status "writable" is indicated by the absence of any predetermined data pattern in the memory word. User data can now be written to a portion of the memory word (e.g., the five MSBs in the example of FIG. 2B). At the same time, a first predetermined data pattern is written to the remaining bit range (e.g., six LSBs in FIG. 2B), the presence of which indicates that the memory word is now in the data status "valid data". When the data becomes invalid, the data status can be changed to "invalid data" by overwriting the first predetermined data pattern with a second predetermined data pattern (further predetermined data pattern). Note that the second predetermined data pattern typically must have a "1" at bit positions where the first predetermined data pattern has a "1", because due to flash memory constraints resetting a single bit from "1" back to "0" is not possible. Accordingly, the second predetermined data pattern fulfils the condition:

second pattern=first pattern OR additional_bit(s)

wherein additional_bit(s)≠(00 . . . 00), that is, the variable additional_bit(s) is unequal to the all-0 vector. In other words, the second pattern is identical to the first pattern, except for at least one additional "1" at a bit position where the first pattern has a "0". As an alternative, one could reserve dedicated bit ranges for data, first pattern, and second pattern. Accessing the memory may therefore comprise a step or action of ascertaining whether the first memory region contains one of the predetermined data pattern and the further predetermined data pattern. Like the predetermined data pattern (first predetermined data pattern), also the further (or second) predetermined data pattern has no influence on the resulting error correcting data determined for at least the first memory region. The action of evaluating the data status for the second memory region may be performed on the basis of a presence or an absence of both, the (first) predetermined data pattern and the further predetermined data pattern in the first memory region. In this manner at least three different values for the data status can be distinguished.

Another optional extension is a "multi level marker", for which an application example is now provided. During a first programming action initiated by a customer software, for example, 32 bits of user data are to be written to the memory. The 32 bits user data are completed by the error correcting data (ECC check bits) to form a valid code word. In short, this may be expressed as: first programming (customer)→32 bit user data→ECC→check bits.

Sometime later, a second programming action is initiated by the customer software. Accordingly, additional 32 bits of user data shall be written. Further 32–22 bits are calculated so that the contribution of the new (32+32) bits on the ECC check bits is zero. Accordingly, no modification of the check bits is necessary.

During a third programming action by the customer software, yet another set of further 32 bits of user data have to be written to the non-volatile memory. This may be done in an analogous manner as the second programming action. It is also possible to continue this scheme with a fourth, fifth, sixth, . . . programming action (until the maximum number of total data bits is reached.

In general, according to the proposed extension it is possible to program x data bits onto the codeword, if in addition y data bits are still free (i.e., typically "0"); these are calculated on the basis of the address, the previous data content and the new data such that the ECC check bits do not have to be modified. To this end, the y columns of the parity check matrix H may be linearly independent (→y=22), or more columns are needed (subspace).

When referring to a word in the memory, the term "word" is used herein as defined now.
Word:

= n data bits + c ecc check bits
= smallest programmable unit that yields a valid ECC codeword Realistic example: n=256, c=22
With these values, the 256 bits can be subdivided in, for example, 4×(32+32) bits, which makes it possible to perform up to four programming actions in one word, as long as one makes sure that the original ECC check bits are not changed.

While flash memories may benefit greatly from the suggestions that are made herein, also they may also be implemented in connection with other types of memory and in particular non-volatile memory. Even though some flash-specific restriction might not apply for general non-volatile memories, such as the unidirectional bit-fine changeability, other memory technologies than flash memories may also benefit from what is suggested herein. For example, the possibility of multi-programming may make it possible to program only a portion of an entire memory word, instead of having to reprogram the entire word. This may result in that individual memory cells are less often re-programmed and therefore experience less stress. Indeed, each programming or erasure operation goes along with some physical stress for the memory cell. Another benefit is that less power may be consumed because the number of memory cells that have to be re-programmed can be lower if only those portions of the memory word are re-programmed where the bit value needs to be changed.

Figure 3:
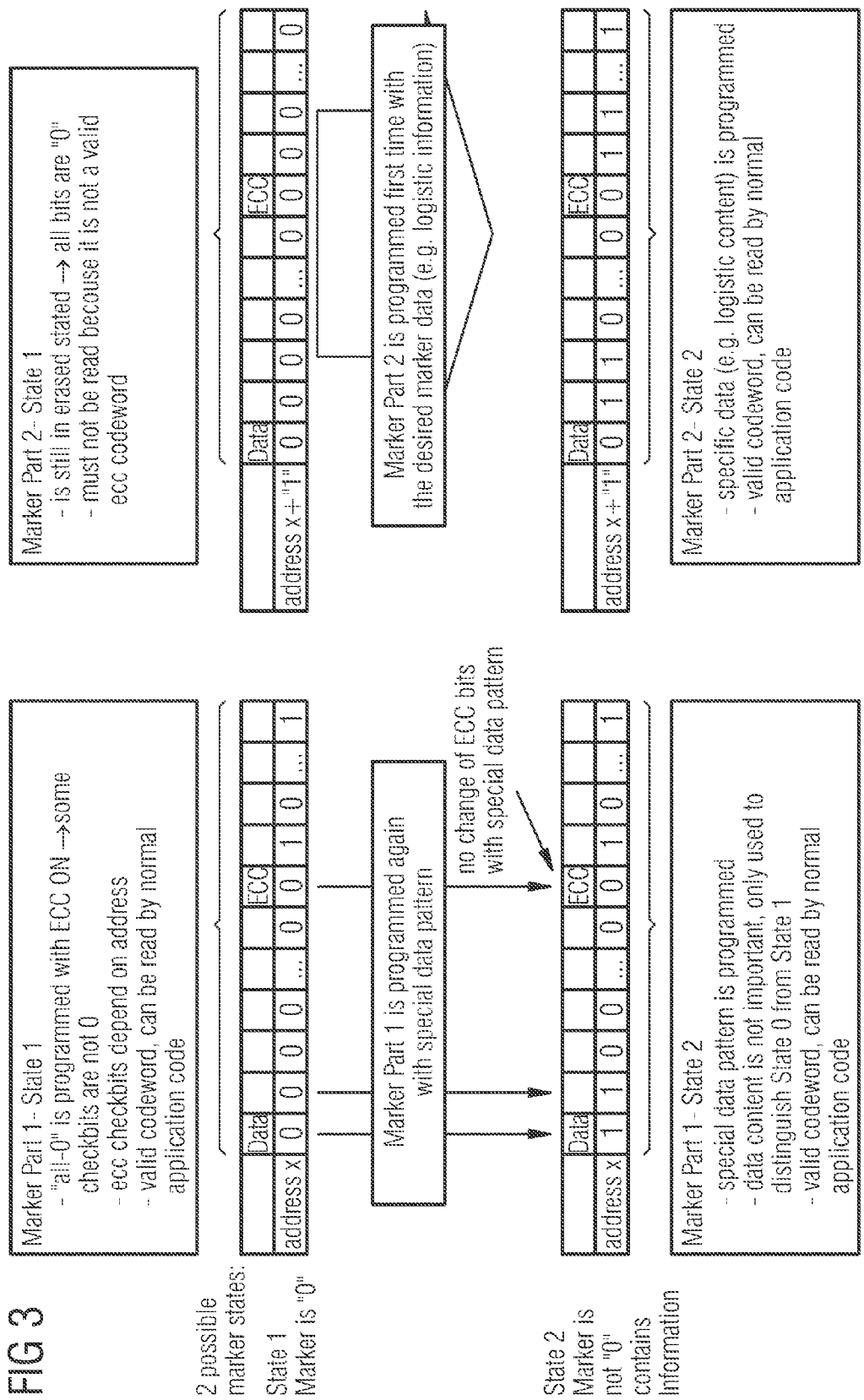
FIG. 3 schematically illustrates a use of a marker that comprises two parts for modifying a data status of a pair of memory words.

FIG. 3 schematically illustrates a method in which a so called "two-Part Marker" is used.

FIG. 3 schematically illustrates an implementation and/or use of a 2-state marker (2-part marker) in a flash memory.

This technique can in particular be used in flash memories in which the erased state cannot be used, because it is ECC invalid.

The marker or predetermined data pattern comprises two parts. In the depicted implementation example, each part covers one memory word of the flash memory. Hence, the first part ("marker part 1") corresponds to a memory word at an address "x" of the flash memory. The second part ("marker part 2") corresponds to a memory word at the next address "x+1". The first part can always be read as an ecc-valid word. In state 1 the first part is programmed as all-0 with valid ecc bits. The second part at address "x+1" is erased in state 1 and must not be read. Remember that the erased state may be ECC invalid in some flash memories, according a-priori convention and/or user requirements.

When passing from state 1 to state 2, an additional special pattern is programmed to the first part. This special pattern does not change the ecc bits because the ecc (pattern)=Gen_Mat x pattern=0. Furthermore as additional optional feature the special pattern does not depend on address, so it can be used at arbitrary addresses. At the same time, the second part is programmed for the first time with the desired data. The desired data may be so called marker data (e.g., logistic information). In other words, the second part can be programmed with arbitrary data to store any customer relevant information (e.g., logistics information about software version). The second part can be read in state 2 as an ECC valid word.

The technique schematically illustrated in FIG. 3 enables a customer to implement markers which are ECC valid "0" at begin and can be changed to a second state with arbitrary data content later.

A special type of flash memory is known as "PFlash" (ProgramFlash). For Flash memory used in, e.g., automotive microcontrollers, the Flash may be divided into two parts: Code Memory and Data Memory. Code Memory is used to store the code of the microcontroller's CPU on-chip. The CPU executes the code which was read from the Code memory—this read path possibly has to be protected very well according to Safety requirements to enable error correction and detection of uncorrectable errors to a high degree. It may be desired that a safety ECC in a flash memory, in particular a PFlash, is done in a way that an erased range of the memory (PFlash) is not ECC valid. For example, a customer, such as an original equipment manufacturer (OEM) or an automotive supplier, may define a corresponding customer request. Under this assumption, reading of an erased word causes ERROR FLAG of ECC: a not correctable error occurs. As a consequence, the execution of a software program may be interrupted. This safety measure may have its justification because the occurrence of an erased range within the allocated portion of a flash memory ("allocated" meaning here: actually used by the software program) may indicate memory corruption or other unpredictable modifications of the memory content. Most likely, the instruction pointer has jumped to a memory address where no data is present. In this case, the software program cannot rely on the correctness of the data in the flash memory anymore, so that it may be advisable to terminate the execution of the software program before serious problems arise.

However, some special software or programs such as a PFlash software loader, boot manager during startup, and application code might need to check that certain PFlash "ranges" are really erased. To this end, markers may be needed to identify the state of code/data written to PFlash. The following explanation illustrates some possible solutions with the emphasis on a "2 Part" Marker solution.

It is proposed to use a marker which consists of (or comprises) 2 parts. The features, functions, and/or purposes of the two parts (part 1 and part 2) can be described as follows.

part 1:
is always ECC valid,
can always be read by software,
and is only used to distinguish the 2 states of the marker.

part 2:
is in erased state unless the marker is updated
and is not read by software unless Part 1 is changed to the 2nd state.

As shown in FIG. 3, the first part (marker part 1) in the state 1 is programmed as "all-0" with ECC ON (i.e., error correction is active). Due to address encoding, some checkbits are not "0". In other words, at least some of the ecc checkbits depend on the address. The combination of the "all-0" vector in the actual memory word and of the corresponding error correcting data defines a valid codeword. As mentioned above, the occurrence of random bit errors in one bit position or a few bit positions typically cannot be ruled out; however due to relatively powerful error correction capabilities based on the error correcting data, such bit errors can be corrected in most cases.

At the same time, the second part (marker part 2) is still in erased state in state 1. Hence, all bits are "0", including the ecc checkbits. As this does not form a valid ecc codeword, it must not be read. The attempt to read the corresponding memory address "x+1" will typically lead to an ecc error (ERROR FLAG of ECC). The address relation between the first part and the second part is known: the first and second parts are stored at consecutive addresses "x", and "x+1". Other address relations may also be possible, such as a page offset, a block offset, or a sector offset between the addresses of the first part and of the second part. As the address relation is known, it is possible to first query (all) the possible address(es) where the first part may be expected, for example, all even addresses 0, 2, 4, 6, . . . . Typically, these addresses can be read safely, because they contain ecc-valid codewords or at least ecc-correctable words. In case the first part is the all-0 vector, it can be concluded that the pair of memory words at addresses "x" and "x+1" form a two-part marker and that the current data status of said two-part marker is "state 1". This means, that the memory word for the second part is still completely erased, and for this reason must not be read. On the other hand, a completely erased memory range is "writable" so that it is highly versatile and can be used to store (almost any) arbitrary data.

When modifying the data status of the memory region comprising the pair of memory words at addresses "x" and "x+1" from state 1 to state 2, the special data pattern is programmed to marker part 1. Marker part 2 is now programmed for the first time (since the last sector-wide erasure) with the desired marker data (e.g., logistic information).

In state 2 the marker is not "0" but contains information. The error correcting data for marker part 1 does not change, because ecc(special pattern)=0. The special data pattern is programmed to marker part 1. The data content of the first memory word at address "x" is not important; it is only used to distinguish state 1 and state 2. The special data pattern and its corresponding error correcting data form a valid codeword which can be read by normal application code.

As to the marker part 2 in state 2, specific data (e.g., logistic content) is now programmed to the memory word at address "x+1". The specific data and its corresponding error correcting data (also stored in the flash memory, typically in additional bits next to the actual data bits) form a valid codeword which can be read by normal application code.

The two-part marker has the desirable properties that it is always ECC valid (at least marker part 1), hence it is always possible to read it, even with safety ecc on. For this reason, there is no need to provide any workarounds, which often result in traps for the programmer, i.e., "no traps, no workarounds". Furthermore, it is relatively fast, because it is only necessary to perform just a read operation to check. Sequence operation is not necessary. As to marker part 2, it may contain arbitrary logistic data, once it has been programmed.

The special data pattern is necessary for Part 1 of the marker. Accordingly, said special data pattern is a value that is reserved for this particular purpose. It may appear also as regular data if the memory addresses of the markers are known (what they usually are). This special data pattern is selected and provided by, for example, a manufacturer of a flash memory controller. The special data pattern typically can be used for all addresses. This makes the use easy because only one data pattern needs to be stored in code for programming/comparison.

We now provide some background information for the special data pattern (predetermined data pattern).

ECC = checkbits
ECC = f_ecc(DATA+ADDR) = f_ecc(DATA) + f_ecc(ADDR)

Accordingly, the error correcting code is linear.

Marker State 1:
DATA = 0...0:
=> ECC = f_ecc(0..0) + f_ecc(ADDR) = f_ecc(ADDR)

This means that the checkbits (ECC) are completely determined by the address.

Marker State 2:
DATA not equal 0..0 but f_ecc(DATA) = 0:
=> ECC = f_ecc(01...10) + f_ecc(ADDR) = f_ecc(ADDR)

This means that the checkbits (ECC) are again completely determined by the address.

Conclusion: the special DATA pattern can be used for all addresses.

In case a flash memory or flash memory controller uses the proposed marker technique, the user manual, the data sheet, or an application note typically should provide some description relative to the usage of the error correcting code. For example, information may be provided in the user manual or data sheet as to which codewords are valid and which are invalid. Furthermore, typically information should be provided as to whether addresses are protected together with the data word by means of ECC, or whether another method is employed. The user manual or data sheet will typically also inform a user as to whether all-0 and/or all-1 are valid codewords.

Figure 4:
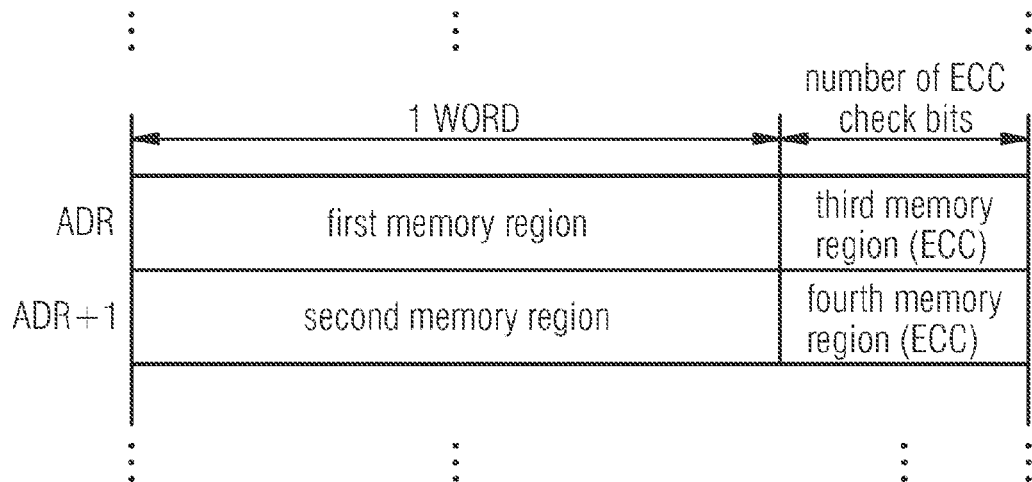
FIG. 4 schematically illustrates a memory region of a non-volatile memory (e.g., flash memory) which may be subject to a data status modification using a predetermined data pattern, the memory region comprising a first, second, third, and fourth memory (sub) regions.

FIG. 4 schematically illustrates a memory region which comprises a first memory region and a second memory region. The first memory region and the second memory region are sub regions of the memory region. The memory region also comprises a third memory region and a fourth memory region. Referring back to the first and second memory regions, the first memory region corresponds to a first memory word (e.g., 16 bit word or 32 bit word or 64 bit word) at an address ADR. The second memory region corresponds to a second memory word at an address ADR+1 directly subsequent to the first memory word. The first and second memory regions are considered as a unit, wherein the first memory region is used to store data status information regarding the memory region. The second memory region is used to store the actual data.

The third memory region is configured to store the error correcting data relative to the first memory region. The fourth memory region is configured to store the error correcting data relative to the second memory region.

Figure 5:
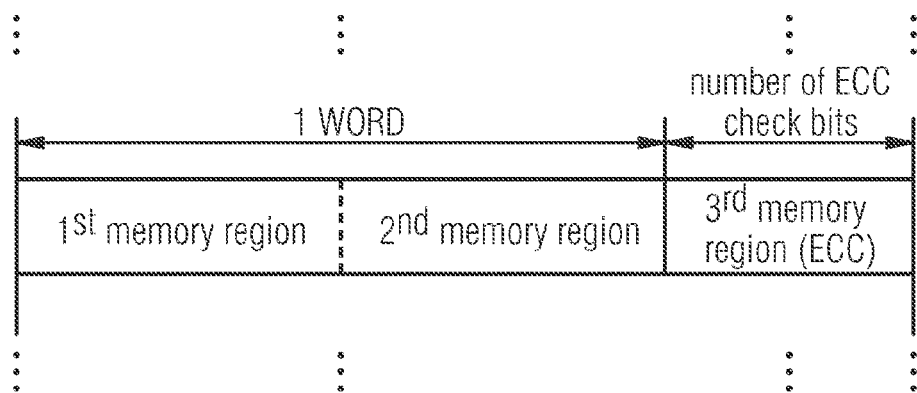
FIG. 5 schematically illustrates a memory region of a non-volatile memory which may be subject to a data status modification using a predetermined data pattern, the memory region comprising a first, second, and third memory (sub) regions, wherein the first and second memory regions each correspond to a part of a memory word.

FIG. 5 is similar to FIG. 4. However, the memory region only extends over one memory word and its error correcting data. The memory word is divided into two parts, namely the first memory part and the second memory part. For example, in case the memory word is 16 bit wide, the eight (8) most significant bits (MSBs) of the memory word may be reserved for the first memory region and the eight (8) least significant bits (LSBs) of the memory word may be reserved for the second memory region. Other divisions between first and second memory regions are also possible. It may even be that the first memory region and the second memory region are interlaced (e.g., even bits: first memory region; odd bits: second memory region). The memory region in FIG. 5 also comprises a third memory region for the error correcting data.

Figure 6:
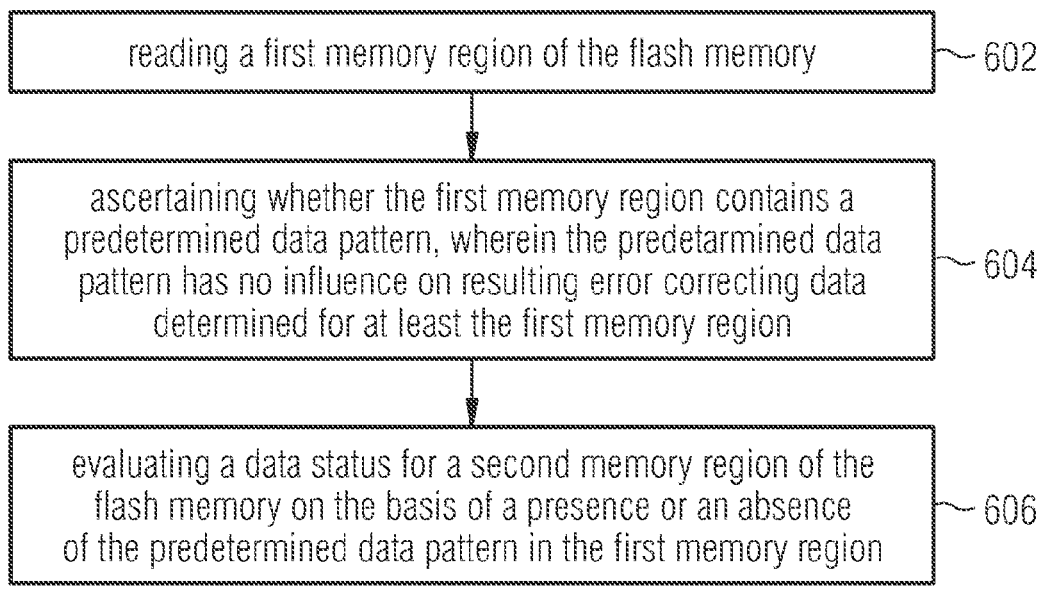
FIG. 6 shows a schematic flow diagram of a method for accessing a non-volatile memory.

FIG. 6 shows a schematic flow diagram of a method for accessing a flash memory. The method comprises a step 602 of reading a first memory region of the flash memory. The first memory region is schematically illustrated in FIGS. 4 and 5 for two different implementations. At a step 604 it is ascertained whether the first memory region contains a predetermined data pattern. The predetermined data pattern has no influence on resulting error correcting data determined for at least the first memory region. The corresponding error correcting data may have been stored in the third memory region (see FIGS. 4 and 5). A data status for a second memory region of the flash memory may then be evaluated at a step 606 on the basis of a presence or an absence of the predetermined data pattern in the first memory region.

The method may further comprise a step for reading the second memory region if the data status indicates a presence of valid data within the second memory region. In this manner, reading the second memory region is only performed conditionally so that read accesses to the second memory region can be controlled. In particular, a read access to the second memory region can be prevented if the second memory region is completely erased (i.e., writable), along with a memory region for corresponding error correcting data, and if the completely erased state is not a valid ECC codeword. In other words, an illegal read access to the completely erased second memory region can be prevented by performing a previous determination of a data status of the memory region.

Furthermore, it may be provided to write data to the second memory region if the data status indicates that the second memory region is writable. In the same context, the predetermined data pattern is written to the first memory region in order to change the data status to indicate a presence of valid data in the second memory region. Both write operations are typically inseparable, in order to prevent that the data status indicated by the first memory region conflicts with the actual data contained in the second memory region.

Individual memory cells of the memory can be individually reprogrammed in a unidirectional manner only. In this context, "unidirectional manner" means, for example, that the transition from "0" to "1" is possible, but the transition from "1" to "0" is not possible. Flash memory may be based on single level cells (SLCs) or on multi-level cells (MLCs). In the case of multi-level cells, for example, a transition from "0" over "1" over "2" to "3" (i.e., from 00 to 01 to 10 to 11) may be possible to program, but "3" to "2" to "1" to "0" may not be possible. The word "individual" refers to the fact that it is only the individual programming of a memory cell (typically 1 bit, or n bits for MLC) is subject to this constraint; block-wise or chip-wise erasing (reprogramming "in the other direction") may indeed be possible. Existing data in a memory cell that has already reached the "end status" (e.g., "1") is not modified any more by the predetermined pattern (because this is simply not possible with individual bit programming in flash memories).

The flash memory may implicitly perform a bitwise OR combination between existing data and new data when writing said new data to the second memory region containing already the existing data, that is resulting memory content=existing data OR new data.

The method may further comprises a step of erasing a memory block comprising the first memory region, the second memory region, and a third memory region to reset the memory block to a writable state and to obtain an erased first memory region, an erased second memory region, and an erased third memory region. Instead of a memory block, data may also be erased on another level, for example, erasing a memory sector, a memory page, or an entire memory chip. The error correcting data for the first memory region may then be determined on the basis of the erased first memory region. As the case may be, the error correcting data may depend on the address of the first memory region. The method also comprises writing the error correcting data for the first memory region to the erased third memory region.

Further to what has been described in the previous paragraph, the memory block may further comprise a fourth memory region for storing error correcting data relative to the second memory region. In a context of erasing the memory block no error correcting data for the second memory region is determined and written to the fourth memory region in order to keep both the second memory region and the fourth memory region in the writable state until actual user data and corresponding error correcting data is to be written to the second and fourth memory regions.

The predetermined data pattern and completely erased error correcting data form a valid codeword of an underlying error correcting code. In other words, the bit vector (pattern, 0, . . . , 0) may be a codeword of the error correcting code.

The first memory region may be a first memory word and the second memory region may be a second memory word having a known address relation relative to the first memory region. According to alternative aspects, the first memory region may be first portion of a memory word and the second memory region may be a second portion of the memory word so that the memory word is divided in the first memory region and the second memory region. However, in this second case, the first memory region and the second memory region share the same error correcting data. This means that it will not be possible, at least in a general manner, to modify the data content of the second memory region in an arbitrary manner, because this may have a repercussion on the error correcting data, that is, the error correcting data would need to be changed. In some few cases such modification of the error correcting data may be possible, because only bit transitions from "0" to "1" occur. In the general case however, the error correcting data cannot be changed in the required manner. Reference is made to FIG. 2A and the corresponding description for a more in-depth explanation of the limitations that have to be taken into account.

Figure 7:
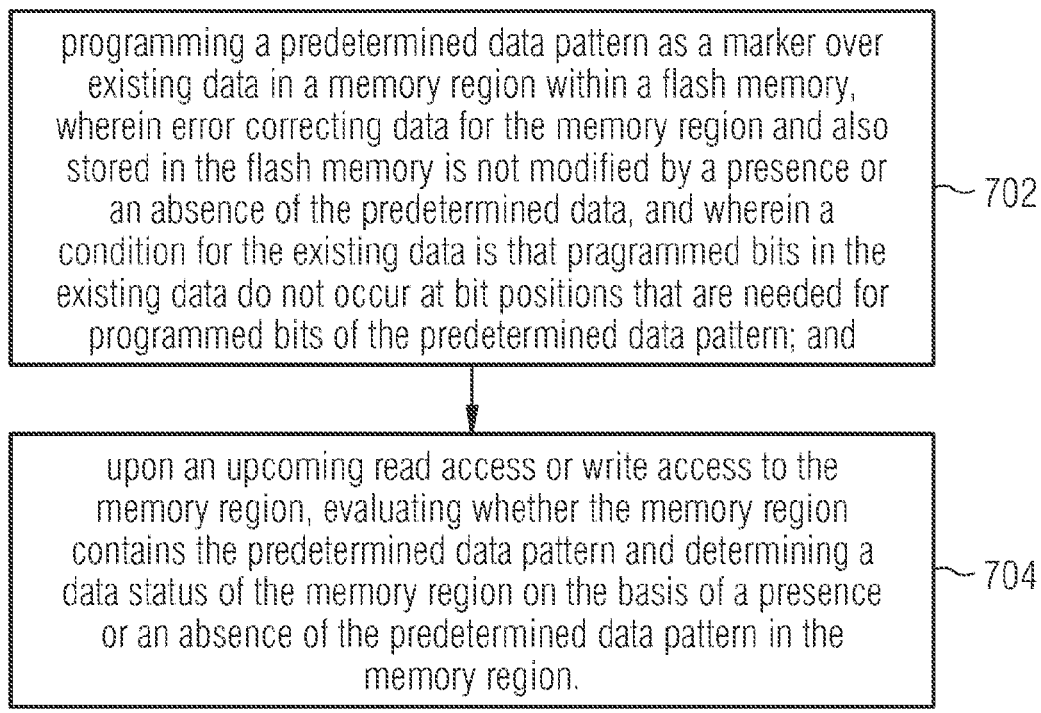
FIG. 7 shows a schematic flow diagram of a method comprising a step of programming a predetermined data pattern as a marker over existing data in a memory region.

FIG. 7 shows a schematic flow diagram of a further proposed method. The method comprises a step 702 of programming a predetermined data pattern as a marker over existing data in a memory region within a flash memory. Error correcting data for the memory region (also stored in the flash memory) is not modified by a presence or an absence of the predetermined data pattern, i.e., the predetermined data pattern is transparent to the error correcting code. One might also say that the predetermined data pattern is in the null space of the error correcting code. A condition for the existing data is that bits in the existing data do not occur at bit positions that are needed for bits of the predetermined data pattern. At a step 704, upon an upcoming read access or write access to the memory region, it is first evaluated whether the memory region contains the predetermined data pattern and determining a data status of the memory region on the basis of a presence or an absence of the predetermined data pattern in the memory region.

FIGS. 8A and 8B show a schematic flow diagram of a method for managing read, write, and erase accesses to a flash memory. At a step 802 a complete memory sector (or block) is erased. As a result, the entire memory sector is now writable. Note that the completely erased state may not be ECC valid in some flash memories (due to convention for safety reasons or due to corresponding customer requests). At step 804 the ECC data is therefore determined for at least one first memory region within the erased memory sector. The ECC data may depend on the address of the first memory region. In practical applications one may consider every other memory word (for example, the memory words at even addresses 0x0, 0x2, 0x4, . . . ) as a plurality of first memory regions. As a result of step 804, the correct error correcting data for the first memory region(s) is/are written to a suitable memory region in step 806, namely the third memory region (see FIGS. 4 and 5, for example), and therefore the first memory region(s) together with the first memory region(s) are ECC valid after step 806 has been completed.

At a later time, an application code might want to check whether it is possible to read a specific memory word within the flash memory, or whether it is possible to write data to said memory word. To this end, the first memory region may be read at a step 808. At a subsequent step 810 it is ascertained whether the first memory region contains the predetermined data pattern. If the answer is no ("N") the data status of the second memory region is "writable" and the method continues at connector point 1. If the answer is yes ("Y"), the data status for the second memory region is "valid data (is) present".

At a branch point 812 a decision is made as to whether a read access should be made to the second memory region. The answer to this question is typically provided by the application code. If the answer is no, the method continues at connector point 2. In the other case, the method proceeds to step 814 where valid data is read from the second memory region. After step 814 the method also continues at connector point 2 which can be found in FIG. 8B.

FIG. 8B starts at the top with connector point 1 which corresponds to the "no" answer of branch point 810. Hence, it has just been ascertained that the data status for the second memory region is "writable". At step 816 the application code is queried as to whether a write access to the second memory region should be performed. If the answer is "no", the method continues at connector point 2 which can be found between steps 818 and 824. If the answer to the query at step 816 is "yes", an inseparable combination 818 of two operations is performed: First, the desired data is written to the second memory region at step 820, and second, the predetermined pattern is written to the first memory region at step 822. The order of steps 820 and 822 can also be inverse. After the inseparable combination 818 has been executed, the method reaches connector point 2.

Following connector point 2, a branching point 824 is provided regarding an erasure of the complete memory sector (or memory block). This decision is typically made by a so called "garbage collector" of the flash memory or of the flash memory controller. In case the decision is made to erase the complete memory sector, the method continues at connector point 3 which can be found at the top of FIG. 8A. In the opposite case, the method continues at connector point 4, which leads to step 808 in FIG. 8A. The erasure of the complete memory sector may comprise copying any existing data to another memory sector.

Figure 9:
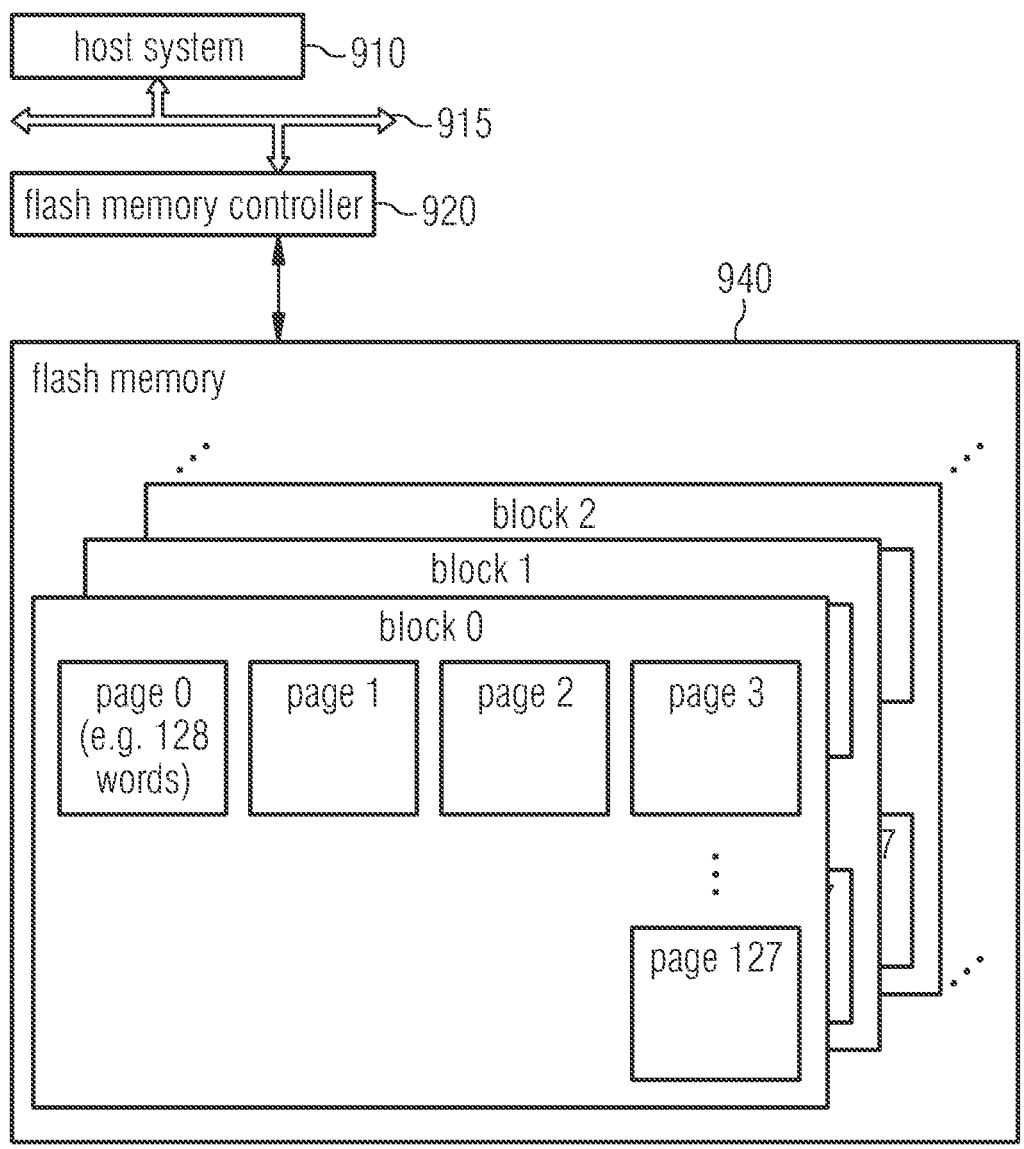
FIG. 9 shows a schematic block diagram of a host system, a memory controller, and a non-volatile memory.

FIG. 9 shows a schematic block diagram of a host system 910, a flash memory controller 920 and a flash memory 940. A bus 915 may be provided to connect the host system 910 to the flash controller 920 and possibly to further periphery devices. The flash memory controller 920 will be explained in more detail in FIG. 10.

The flash memory 940 may comprises several memory blocks, e.g., block 0, block 1, block 2 . . . . Each block may comprise a plurality of pages, for example, 128 pages starting at page 0 up to page 127. Each page is being subdivided in several memory words, for example, 128 words. As explained above, depending on the flash technology that is used (NAND flash or NOR flash, to name the two most widely used types), data may be written to and read from the flash memory one entire page at a time, as is the case with NAND flash. NOR type flash typically allows a single machine word (byte) to be written or read independently, that is, the minimum write granularity is equal to the ECC width, but may also be bigger (several ECC words combined). When data needs to be erased, this is typically only possible one entire block at a time. Flash typically has a smaller footprint than, for example, an EEPROM so that more data per area can be stored (higher data density). Flash memories may exhibit a speed advantage over some types of non-flash memories, especially when writing large amounts of data.

Figure 10:
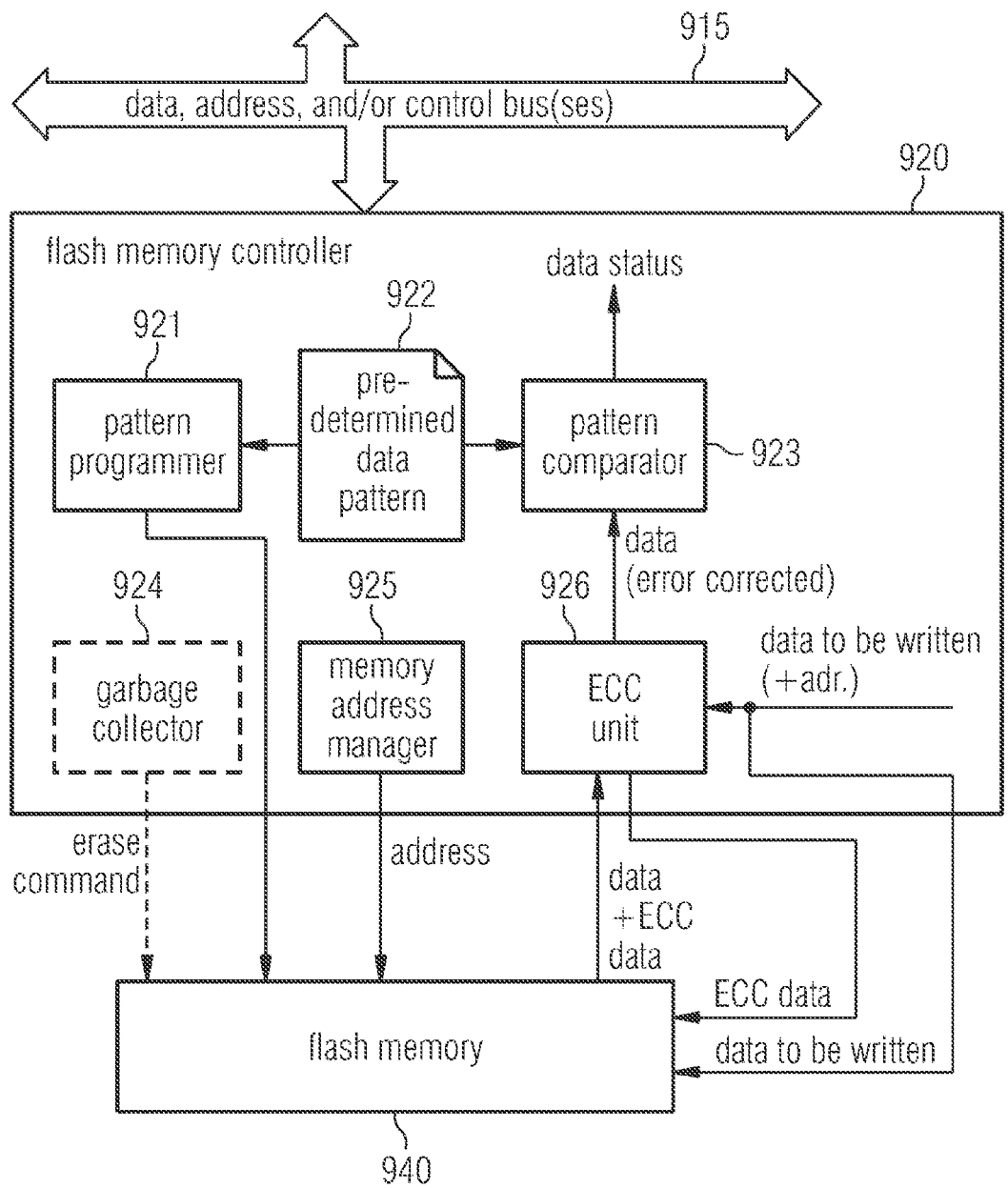
FIG. 10 shows a schematic block diagram of a flash memory controller.

FIG. 10 shows a schematic block diagram of a flash memory controller 920. The flash memory controller 920 comprises a pattern programmer 921, a storage 922 for a predetermined pattern, a pattern comparator 923, optionally a garbage collector 924, a memory address manager 925, and an error correcting unit (ECC unit) 926. The flash memory controller 920 is connected to the bus 915 and to the flash memory 940. The bus 915 usually comprises a data bus, an address bus, and/or a control bus.

The pattern programmer 921 is configured to write the predetermined data pattern to a memory region of the flash memory 940. As already mentioned above, the predetermined data pattern has no influence on resulting error correcting data determined for at least the first memory region. The predetermined pattern is provided by a storage 922 within the flash memory controller. The storage 922 may be hardwired or it may comprise a register. An address within the flash memory 940 where the predetermined data pattern shall be written to is determined by the memory address manager 925 and provided to the flash memory 940.

The pattern comparator 923 is configured to compare data read from the first memory region of the flash memory with the predetermined data pattern, and for evaluating a data status for a second memory region of the flash memory on the basis of a presence of an absence of the predetermined data pattern in the first memory region.

The error correcting unit 926 is configured to process data to be stored in a flash memory to obtain corresponding error correcting data also to be stored in the flash memory, and for performing error detection and correction on the basis of data and corresponding error correction data read from the flash memory. When data shall be written to the flash memory 940, the ECC unit 926 receives the data to be written. In addition, the ECC unit 926 may also receive the address within the flash memory 940 where the data shall be written to. The data to be written and the corresponding error correcting data are then provided to the flash memory 940. The memory address manager 925 provides the address to the ECC unit 926 and also to the flash memory 940.

When data shall be read from the flash memory 940, the data and the corresponding error correcting data (ECC data) is read at an address specified by the address manager 925. The data, the ECC data, and the address are provided to the ECC unit 926 which uses these inputs in order to perform error correction on the data and the ECC data, if possible. The error corrected data may then be provided to the pattern comparator 923, or it may be provided directly to the host system 910 (FIG. 9) via the bus 915. The error corrected data may be provided directly to the host system 910 if it has been read from a second memory region. Recall that in some implementations the second memory region is either completely erased (including the corresponding memory portion for storing the corresponding error correcting data), or it contains actual user data other than the predetermined data pattern.

According to further possible aspects, a method is provided for modifying a data status of a memory word in a memory. The method comprises writing a predetermined pattern to at least a portion of the memory word or of another memory word having a known address relation to the memory word, wherein a presence or an absence of the predetermined pattern does not change resulting error correcting data for the memory word or the other memory word when subjecting the memory word or the other memory word to a corresponding calculation of said error correcting data in accordance with an error correcting code, wherein the absence of the predetermined pattern indicates a first data status of the memory word, and wherein the presence of the predetermined pattern indicates a second data status of the memory word.

The error correcting data may be stored in the memory.

Depending on the type of flash memory, it may be that individual memory cells of the memory can be individually reprogrammed in a unidirectional manner only. For example, the memory may implicitly perform a bitwise OR combination between the predetermined pattern and existing data in the memory word or the other memory word.

The first data status may indicate that data contained in at least a portion of the memory word is valid. The second data status may indicate that the data contained in at least the portion of the memory word is invalid. The method may further comprise reading at least the portion of the memory word or of the other memory word, and determining the data status on the basis of an evaluation as to whether the predetermined pattern is present in the memory word or in the other memory word.

If the data status of the memory word is valid, the method may comprise a step of performing at least one of a read access and a write access on the memory word.

The method may further comprise a step of reading the memory word or the other memory word. Error correction on the memory word or the other memory word may then be performed using the error correcting data.

The error correcting data may also be based on an address of the memory word or the other memory word.

The memory word may comprise a first plurality of bits reserved for actual data to be stored in the memory word, and a second plurality of bits disjoint from the first plurality of bits, the second plurality of bits being reserved for the predetermined pattern.

According to another aspect, a method for writing data to a non-volatile memory region may comprise a step or action of reading already existing data in that memory region. The data intended to be written may then be written to a part of the memory region not being occupied by the already existing data. The method may further comprise a step/action of calculating additional auxiliary data based on the address, the already existing data, and the new data so that an error correcting data for the address, the existing data, the new data and the auxiliary data is the same as an already existing error correcting data for the existing data. The auxiliary data may be written to a memory region not being occupied by the existing data or the new data, i.e., the auxiliary data may be written to a further portion of the memory region that is not occupied by the existing data or that will be occupied by the new data.

This method makes it possible to modify the existing data by complementing it with the new data to form a new data value, or to give the existing data a new meaning or interpretation. At the same time, the auxiliary data may compensate any changes within the codeword that would normally have to be reflected in the error correcting data. By keeping the error correcting data constant and by writing the new data and the auxiliary data to portions of the memory region that are not yet occupied by existing data, an erasure of existing data in the memory region can be avoided or at least delayed to a later write operation. As a result, a lower power consumption, higher endurance, and/or higher speed of the memory may be expected.

Note that after completion of the write access, the new data and the auxiliary data become existing data that will have to be considered by a subsequent write access.

When formulated as a list, the above mentioned method can be described, for example, as follows:

A method for writing data to a non-volatile memory region comprising:
 reading already existing data in that memory region;
 writing the data to a part of the memory region not being occupied by the already existing data;
 calculating additional auxiliary data based on the address, the already existing data, and the new data so that an error correcting data for the address, the existing data, the new data and the auxiliary data is the same as an already existing error correcting data for the existing data; and
 writing the auxiliary data to the memory region not being occupied by existing or new data.

The concept described above in terms of a method for writing data to a non-volatile memory may also be applied to a memory controller. For example, the memory controller may be instructed to write data to the non-volatile memory. Before actually writing the data to a memory region, the memory controller may read already existing data in the target memory region. The memory controller may consider several parts within the target memory region. In case one of these parts is completely empty (e.g., it contains only zeros), the memory controller may consider that no data exists in this particular part of the memory region. The memory controller may further conclude that this particular part is available for writing new data and/or auxiliary data to the memory region, without the need to erase the memory region (and possibly even the entire memory block, as it may be the case with flash memories). The memory controller may distinguish between those parts of the memory region that are intended for the new data and those parts of the memory region that are intended for the auxiliary data, in order to be able to distinguish between both types of data when reading the memory region. Typically, the auxiliary data is used during an error correcting step, but after that it can typically be ignored when reading the memory region. The memory controller may be further configured to read the error correcting data from the memory region and to reconstruct the codeword, at least within the possibilities of the employed error correcting code (e.g., 2-bit error correcting code, that is, up to two erroneous bits can be corrected).

The memory controller may comprise a register (or a similar structure) that typically has the size of the memory region, so that the memory controller may read the memory region and store its content while executing the write operation for writing data to said memory region. Note that reading the memory region corresponds to copying the content of the memory region to the register.

The memory controller may further comprise an occupancy detector configured to detect, whether a certain part of the memory region is currently occupied by existing data. The occupancy detector may comprise one or more comparators and logic circuits. Furthermore, the occupancy detector may comprise a data type determiner configured to determine whether the data within a certain part of the memory region is payload data or auxiliary data. The data type determiner may work on the basis of a subdivision of the memory region. For example, a less significant range of bits of the memory region may be reserved for the auxiliary data and a higher significant range of the bits may be reserved for actual user data (payload data). Furthermore, a particular bit range may be reserved for the error correcting data.

The memory controller may further comprise an error corrector configured to reconstruct the original codeword, as far as possible, from the data read from the memory region. The memory controller may also comprise an auxiliary data calculator configured to calculate the auxiliary data so that the existing error correcting data can be kept unmodified, and only additional data (new data and auxiliary data) is written to non-occupied parts of the memory region. The auxiliary data and the new data may be temporarily stored in the register, before the memory controller writes the register to the memory region. As an alternative, it may be possible to write only those parts of the register to corresponding parts of the memory region that contain the new data and/or the auxiliary data.

When formulated as a list, the afore-mentioned memory controller or device can be described as follows:

A device, for example, a memory controller, for writing data to a non-volatile memory region, the device being configured for:
  reading already existing data in that memory region;
  writing the data to a part of the memory region not being occupied by the already existing data;
  calculating additional auxiliary data based on the address, the already existing data and the new data so that the error correcting data for the address, the existing data, the new data and the auxiliary data is the same as an already existing error correcting data for the existing data; and
  writing the auxiliary data to the memory region not being occupied by existing or new data.

Alternatively, a device may be provided that may be described as follows:

A device, e.g., a memory controller, comprising:
  an error detector configured to reconstruct an original codeword from a content read from a memory region, wherein the original codeword belongs to an error correcting code and comprises a portion of already existing data, a portion of error correcting data, an empty portion provided for new data, and an empty portion for auxiliary data; and
  an auxiliary data calculator configured calculate the auxiliary data at least on the basis of the already existing data, the error correction data, and new data to be written to the memory region, so that the auxiliary data compensates the new data in an error correcting data domain of the error correcting code so that the error correcting data of the original codeword can be kept unmodified. Optionally, only the additional data (new data and auxiliary data) is written to the non-occupied (or empty) parts of the memory region.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding unit or item or feature of a corresponding apparatus.

Depending on certain implementation requirements, embodiments of embodiments can be implemented in hardware or in software. The implementation can be performed using a digital storage medium, for example, a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to embodiments comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may, for example, be configured to be transferred via a data communication connection, for example, via the Internet.

A further embodiment comprises a processing means, for example, a computer, or a programmable logic device, configured to or adapted to perform one of the methods described herein.

A further embodiment comprises a computer having installed thereon the computer program for performing one of the methods described herein.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

What is claimed is:

1. A method for accessing a non-volatile memory, the method comprising:
    reading a first memory region of the non-volatile memory;
    ascertaining whether the first memory region contains a predetermined data pattern, wherein the predetermined data pattern has no influence on resulting error correcting data determined for at least the first memory region; and
    evaluating a data status for a second memory region of the non-volatile memory on the basis of a presence of the predetermined data pattern in the first memory region, wherein the data status indicates at least one of whether valid data is present within the second memory region and whether the second memory region is writable.

2. The method according to claim 1, further comprising reading the second memory region if the data status indicates a presence of valid data within the second memory region.

3. The method according to claim 1, further comprising:
    writing data to the second memory region if the data status indicates that the second memory region is writable; and
    writing the predetermined data pattern to the first memory region in order to change the data status to indicate a presence of valid data in the second memory region.

4. The method according to claim 1, wherein the non-volatile memory is a flash memory and wherein individual memory cells of the non-volatile memory can be individually reprogrammed in a unidirectional manner only.

5. The method according to claim 1, wherein the non-volatile memory implicitly performs a bitwise OR or a bitwise AND combination between existing data and new data when writing said new data to the second memory region containing already the existing data.

6. The method according to claim 1, further comprising:
    erasing a memory block comprising the first memory region, the second memory region, and a third memory region to reset the memory block to a writable state and to obtain an erased first memory region, an erased second memory region, and an erased third memory region;
    determining the error correcting data for the first memory region on the basis of the erased first memory region; and
    writing the error correcting data for the first memory region to the erased third memory region.

7. The method according to claim 6, wherein the memory block further comprises a fourth memory region for storing error correcting data relative to the second memory region, wherein in a context of erasing the memory block no error correcting data for the second memory region is determined and written to the fourth memory region in order to keep both the second memory region and the fourth memory region in the writable state until actual user data and corresponding error correcting data is to be written to the second and fourth memory regions.

8. The method according to claim 1, wherein the error correcting data for a memory region is a function of at least a data content of the memory region and of an address of the memory region.

9. The method according to claim 1, wherein the first memory region and the corresponding error correcting data do not form a valid codeword of an underlying error correcting code when the first memory region and the corresponding error correcting data are completely erased.

10. The method according to claim 1, wherein the predetermined data pattern and the error correcting data for a completely erased data form together a valid codeword of an underlying error correcting code.

11. The method according to claim 1, wherein the first memory region is a first memory word and the second memory region is a second memory word having a known address relation relative to the first memory region.

12. The method according to claim 1, further comprising
    ascertaining whether the first memory region contains a further predetermined data pattern, wherein the further predetermined data pattern has no influence on the resulting error correcting data determined for at least the first memory region, and wherein an action of evaluating the data status for the second memory region is in addition performed on the basis of a presence of the further predetermined data pattern in the first memory region so that at least three different values for the data status can be distinguished.

13. The method according to claim 1, further comprising writing the predetermined data pattern to the first memory region to invalidate possibly existing data in the second memory region, if the first memory region does not already contain the predetermined data pattern and if an invalidation of the possibly existing data in the second memory region is desired.

14. A method comprising:
    programming a predetermined data pattern as a marker over existing data in a memory region within a non-volatile memory, wherein error correcting data for the memory region and also stored in the non-volatile memory is not modified by a presence of the predetermined data pattern, and wherein bits in the existing data do not occur at bit positions that are needed for bits of the predetermined data pattern; and
    upon an upcoming read access or write access to the memory region, evaluating whether the memory region contains the predetermined data pattern and determining a data status of the memory region on the basis of a presence of the predetermined data pattern in the memory region.

15. The method according to claim 14, wherein the data status of the memory region indicates whether at least a portion of the memory region is writable or contains valid data.

16. A non-transitory computer-readable medium storing a program that causes a computer to execute a method according to claim 1 when the method is executed by the computer.

17. A flash memory controller comprising:
- an error correcting unit for processing data to be stored in a non-volatile memory to obtain corresponding error correcting data also to be stored in the non-volatile memory, and for performing error detection and correction on the basis of data and corresponding error correction data read from the non-volatile memory;
- a pattern programmer for writing a predetermined data pattern to a memory region of the non-volatile memory, wherein the predetermined data pattern has no influence on resulting error correcting data determined for at least a first memory region; and
- a pattern comparator for comparing data read from the first memory region of the non-volatile memory with the predetermined data pattern, and for evaluating a data status for a second memory region of the non-volatile memory on the basis of a presence of an absence of the predetermined data pattern in the first memory region, wherein the data status indicates at least one of whether valid data is present within the second memory region and whether the second memory region is writable.

18. The flash memory controller according to claim 17, wherein the flash memory controller is authorized to perform a read access to the second memory region if the data status indicates a presence of valid data within the second memory region.

19. The flash memory controller according to claim 17, wherein the flash memory controller is authorized to perform a write access to the second memory region and to cause the non-volatile memory to write the predetermined data pattern to the first memory region if the data status indicates an absence of valid data within the second memory region.

20. The flash memory controller according to claim 17, further comprising a garbage collector unit configured to erase at least a memory block comprising the first memory region, the second memory region, and a third memory region to reset the memory block to a writable state and to obtain an erased first memory region, an erased second memory region, and an erased third memory region, wherein the error correcting unit is further configured to determine the error correcting data for the memory region on the basis of the erased first memory region, and wherein the flash memory controller is configured to cause the non-volatile memory to write the error correcting data for the first memory region to the erased third memory region.

21. The flash memory controller according to claim 17, wherein the error correcting unit is configured to take into account a data content of the memory region and an address of the memory region.

22. The flash memory controller according to claim 17, wherein the first memory region and the corresponding error correcting data do not form a valid codeword of an underlying error correcting code when the first memory region and the corresponding error correcting data are completely erased.

23. The flash memory controller according to claim 17, wherein the predetermined data pattern and the error correcting data for a completely erased data form together a valid codeword of an underlying error correcting code.

* * * * *